United States Patent [19]

Dzarnoski, Jr. et al.

[11] Patent Number: 4,980,002
[45] Date of Patent: Dec. 25, 1990

[54] METHOD OF FABRICATING A LAYERED ELECTRONIC ASSEMBLY HAVING COMPENSATION FOR CHIPS OF DIFFERENT THICKNESS AND DIFFERENT I/O LEAD OFFSETS

[75] Inventors: John E. Dzarnoski, Jr., Poway; James W. Babcock, Escondido, both of Calif.

[73] Assignee: Unisys Corporation, Blue Bell, Pa.

[21] Appl. No.: 395,250

[22] Filed: Aug. 16, 1989

[51] Int. Cl.$^5$ ............................................. B32B 31/20
[52] U.S. Cl. ........................................ 156/64; 29/830; 29/834; 156/295; 156/321; 156/378; 156/379; 156/556; 357/75
[58] Field of Search ............... 156/285, 295, 556, 364, 156/64, 60, 299, 378, 379, 321; 357/75, 79; 361/380, 392, 393, 387, 420; 29/830, 834; 437/208; 428/901

[56] References Cited

U.S. PATENT DOCUMENTS

| | | | |
|---|---|---|---|
| 3,834,966 | 9/1974 | Kelly | 156/64 X |
| 4,398,660 | 8/1983 | Pampalone et al. | 156/332 X |
| 4,704,319 | 11/1987 | Belanger et al. | 357/75 X |
| 4,706,166 | 11/1987 | Go | 357/75 |
| 4,777,374 | 10/1988 | Nakata et al. | 356/401 X |

FOREIGN PATENT DOCUMENTS 63-41030  2/1988  Japan .................................. 156/556

*Primary Examiner*—Michael W. Ball
*Assistant Examiner*—Michele K. Yoder
*Attorney, Agent, or Firm*—Charles J. Fassbender; Mark T. Starr

[57] ABSTRACT

Layered electronic assemblies are fabricated from a plurality of integrated circuit chips that have respective thicknesses which vary from chip to chip, and have I/O leads which are offset from one edge of the chip on which they lie by respective distancess which vary from chip to chip. Each layered electronic assembly is formed by the steps of: (a) disposing an uncured adhesive material between one of the chips "i" and another of the chips i+1 without regard to their respective thicknesses and respective distances by which their I/O leads are offset; (b) moving the chips i and i+1 relative to one another with the uncured adhesive material lying between them until their I/O leads are aligned and separated by a predetermined spacing; (c) curing the adhesive between the chips i and i+1 while their I/O leads are kept aligned and separated at the predetermined spacing; and, (d) repeating in a serial fashion, the forming, moving, and curing steps once for each remaining chip in said plurality, where i equals 1, 2, ... N. Using this process, 100% of the electrically functional chips which are cut from a semiconductor wafer can be used without sacrificing any accuracy with which the I/O leads are aligned on the stack face.

12 Claims, 5 Drawing Sheets

METHOD OF FABRICATING A LAYERED ELECTRONIC ASSEMBLY HAVING COMPENSATION FOR CHIPS OF DIFFERENT THICKNESS AND DIFFERENT I/O LEAD OFFSETS

BACKGROUND OF THE INVENTION

This invention relates to the structural details of, and processes for forming, high density layered electronic assemblies of the type which contain a stack of integrated circuit chips with conductors on one face of the stack that electrically interconnect the chips.

In the prior art, layered electronic assemblies of the above type are described in U.S. Pat. Nos. 4,704,319 to Belanger et al, and 4,706,166 to Go. According to the teachings of Belanger et al, such layered electronic assemblies are formed by "a rather elaborate method" which "uses three separate fixtures",-column 4, lines 5-8. The first fixture is used to "dry stack" the chips which involves selecting and stacking the chips, without any epoxy between them, based on the chip thicknesses and microscopic inspection of their circuitry; the second fixture is used to "wet stack" the chips which involves spreading uncured epoxy over the chips that are selected for the dry stack; and the third fixture is used to align the chips and hold them in alignment while the epoxy is cured. See column 6, lines 14-32; column 6, line 54-column 7 line 5; column 7, lines 65-67 and column 9, lines 7-31.

A major drawback, however, with the Belanger et al process is that the percentage of chips which are suitable for use in the stack is very low. Column 6, lines 14-21 states that the percentage of chips which are suitable for stacking "may run as low as 5% of the chips originally cut from the wafers". This means that up to 95% of the chips in the wafer, which are electrically functional, are unsuitable for use in the stack.

Such a poor yield is due to the fact that in the Belanger et al process, the chips which are used must be handpicked based on their thickness and the distance which their input/output leads (I/O leads) are located from the edge of the chip. If the thickness of the chips is ignored, then the distance of the I/O leads between chips in the stack will randomly vary; and if the distance of the I/O leads from the chip's edge of the chips is ignored, then the alignment of the I/O leads in the stack will randomly vary. In turn, these variations in the location of the I/O leads in the stack will make it difficult, if not impossible, to interconnect them with conductors on the stack's face.

How such interconnections have been made on the stack's face and how the conductors on that face have been connected to a substrate is described in U.S. Pat. No. 4,706,166 to Go. Column 4 lines 5-33 of the Go patent describes a method by which the I/O leads of the layered electronic assemblies are interconnected with patterned metal lines by processing each assembly separately. However, such processing of each stack separately presents additional serious drawbacks.

In particular, when a layer of photoresist is disposed on a single cube by spinning the cube with liquid resist on its face, the resulting layer will not be flat. Instead, the liquid resist will bead up and be thicker around the perimeter of the cube due to surface tension. Such non-uniformity in thickness limits the precision with which the resist can be patterned. This beading effect also occurs when a liquid insulating layer, such as a polyimide layer, is spun on the cube's face. Further, the beading effect is cumulative and becomes larger for each spun-on layer; and that in turn, aggravates the task of interconnecting the cube's I/O leads with multiple layers of conductors.

Also, as a liquid resist or insulator is disposed on a cube's face by spin coating, the cube's face will actually spin faster than the liquid. This is because the liquid slips on the spinning face. Such slippage presents another uniformity problem since the liquid will slip off of the cube's face near its corners. Also, the liquid which slips off one corner of the cube will splatter into the next corner of the cube.

Processing each cube separately also subjects the cube to physical damage. When a cube is processed, it must somehow be handled, or moved, into and out of various processing equipment such as a sputtering machine or a photoresist spinning machine. During this handling, an I/O lead can become open-circuited by being scratched; or an insulating layer can become cracked by exerting too much pressure on it.

Go's processing of each cube separately also is very time-consuming and expensive. This becomes apparent when his method is compared to a method that is disclosed herein which reduces Go's processing time and cost by several hundred percent. Further, the method disclosed herein avoids the above beading problem and the above physical damage problem.

Accordingly, a primary object of the present invention is to address the above-described problems and overcome them.

BRIEF SUMMARY OF THE INVENTION

The present invention as claimed relates to methods for fabricating layered electronic assemblies from a plurality of integrated circuit chips that have respective thicknesses which vary from chip to chip, and have I/O leads which are offset from one edge of the chip on which they lie by respective distances which vary from chip to chip. According to the present invention, each layered electronic assembly is formed by the steps of: (a) disposing an uncured adhesive material between one of the chips "i" and another of the chips $i+1$ without regard to their respective thicknesses and respective distances by which their I/O leads are offset; (b) moving the chips i and $i+1$ relative to one another with the uncured adhesive material lying between them until their I/O leads are aligned and separated by a predetermined spacing; (c) curing the adhesive between the chips i and $i+1$ while their I/O leads are kept aligned and separated at the predetermined spacing; and, (d) repeating in a serial fashion, the forming, moving, and curing steps once for each remaining chip in said plurality, where i equals 1, 2, . . . N and wherein N is the number of chips in the assembly. Using this process, 100% of the electrically functional chips which are cut from a semiconductor wafer can be used without sacrificing any accuracy with which the I/O leads are aligned on the stack face.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
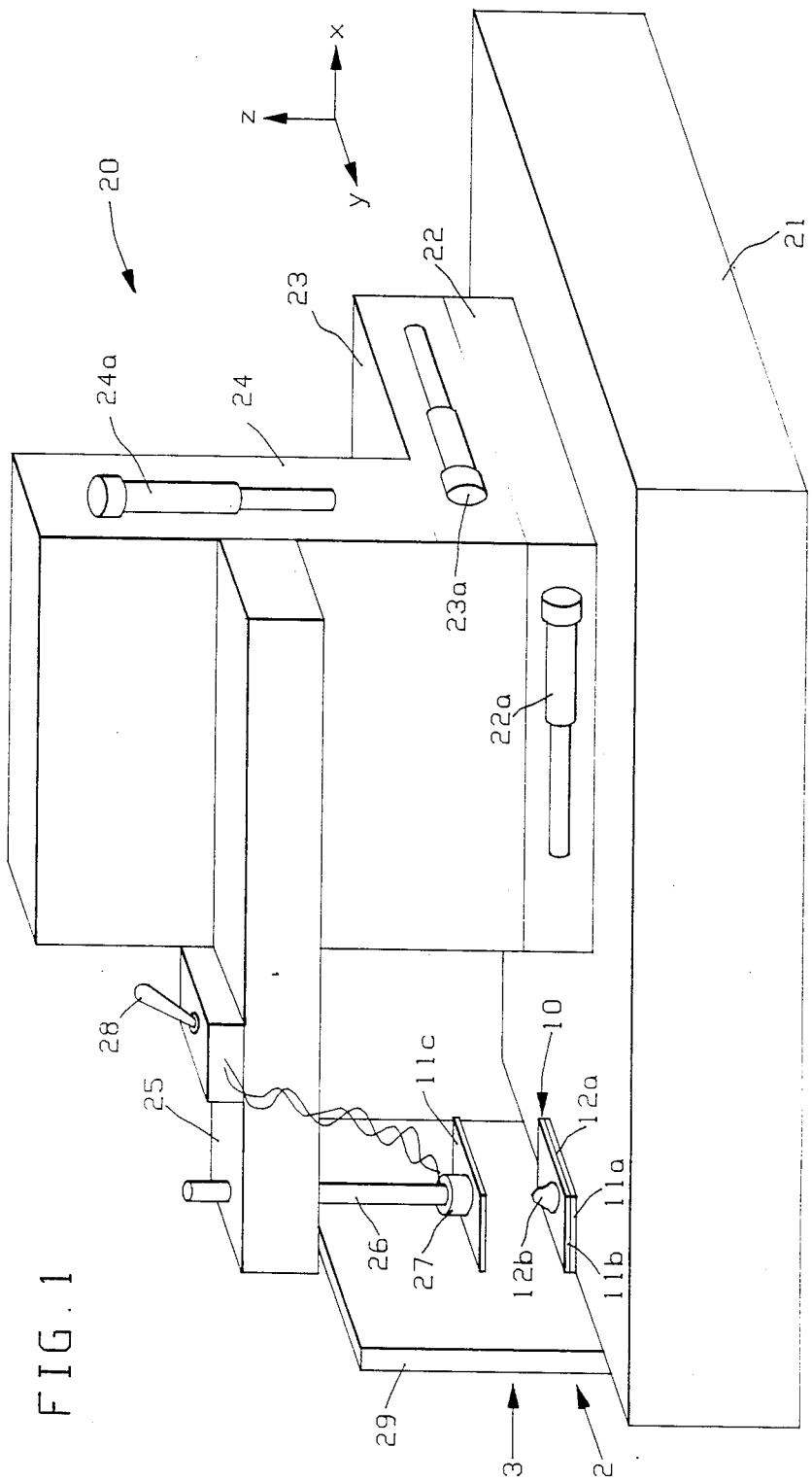
FIG. 1 illustrates a layered electronic assembly which is being fabricated in accordance with the invention.

Referring now to FIG. 1, it shows a novel layered electronic assembly 10, as well as a novel process for fabricating the assembly. This process uses an apparatus 20 which includes a base 21 on which three linear-positioning stages 22, 23, and 24 are mounted in series. Stage 22 has a micrometer 22a which moves all of the stages 22-24 in the X direction; stage 23 has a micrometer 23a which moves the stages 23 and 24 in the Y direction; and stage 24 has a micrometer 24a which moves that stage in the Z direction. An arm 25 is rigidly connected to stage 24; and that arm is moved in the X-Y-Z directions respectively by the micrometers 22a, 23a, and 24a. Arm 25 carries a vacuum chuck 26, an electric heater 27, and a switch 28 which turns the heater on and off. Also in the apparatus 20 is a transparent reticle 29 which is attached to the base 21 near the vacuum chuck 26.

Included in the layered electronic assembly 10 are a plurality of integrated circuit chips 11a, 11b, . . . etc. These chips are arranged in a stack, and they are held together by respective adhesive layers 12a, 12b, . . . which interleave the chips. Using the above described apparatus 20, the layered electronic assembly 10 is fabricated one chip at a time. FIG. 1 shows the layered electronic assembly 10 at an intermediate stage of manufacturing in which two of the chips 11a and 11b have previously been attached to each other, and another chip 11c is in the process of being attached to chip 11b.

In the attachment process, chip 11c is placed in the vacuum chuck 26, and an uncured adhesive material 12b is dispensed between the chips 11b and 11c. Thereafter, chip 11c is moved into alignment with the previously attached chips 11a-11b. This alignment is achieved by moving chip 11c via the micrometers 22a-24a and viewing its position through the reticle 29 under a microscope (not shown). During this alignment, chip 11c squeezes the adhesive 12b between itself and the underlying chip 11b such that the adhesive completely covers their facing surfaces and forms a continuous electrically insulative layer between the chips. Any excess adhesive is simply squeezed out from between the two chips 11b and 11c. After the alignment is complete, switch 28 is thrown to turn on heater 27. This heats the adhesive 12b and causes it to cure. Thereafter, the above steps are repeated once for each additional chip that remains to be attached in the layered electronic assembly 10. To insure that the adhesive does not stick to the reticle 29, the reticle's surface 29a preferably is coated with a release material, such as Frekote #44 or #700 which is manufactured by Frekote, Inc. of Florida.

Figure 2:
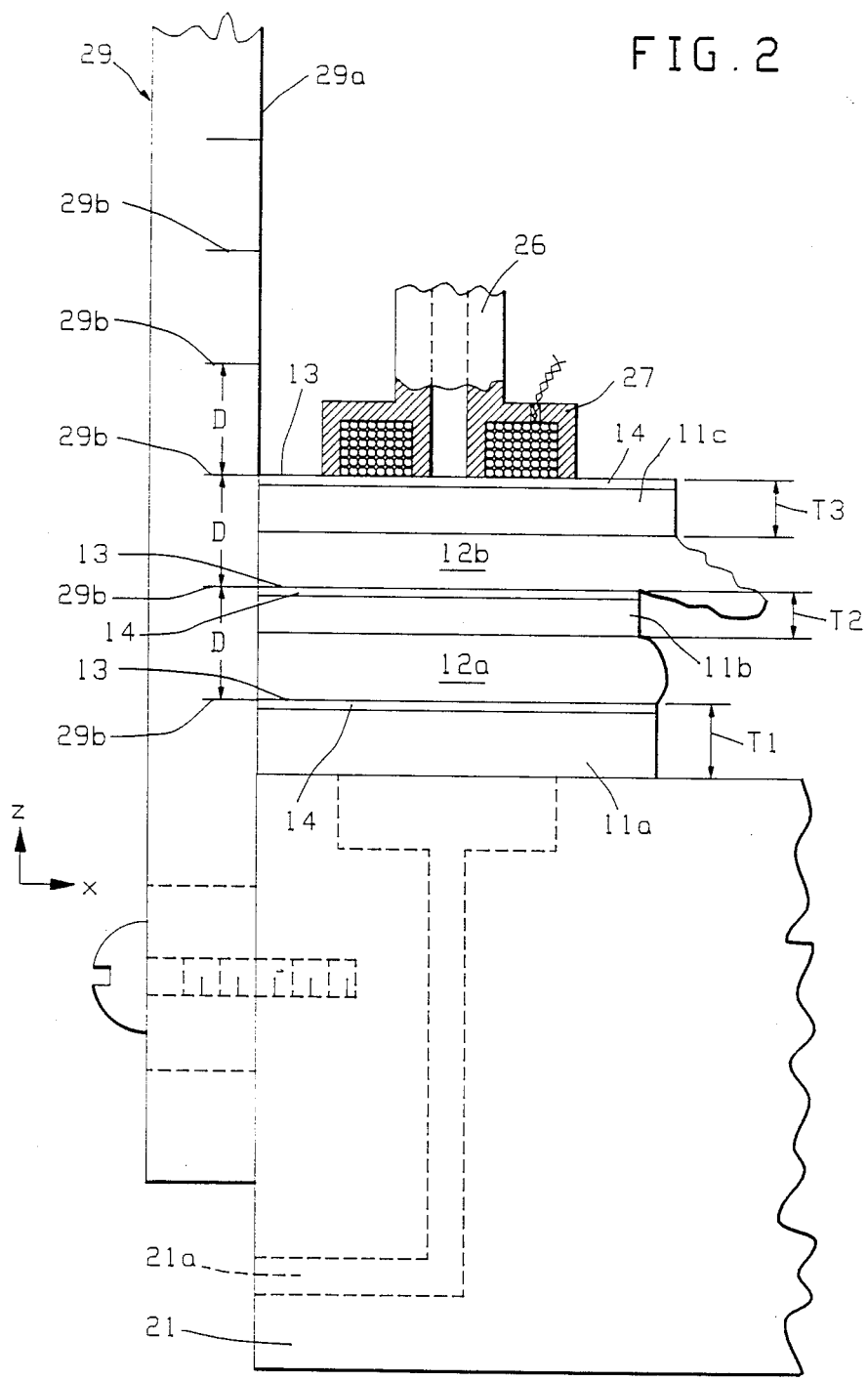
FIG. 2 is a detailed view of the FIG. 1 assembly taken in the Y direction which illustrates some of its novel structural features.
Figure 3:
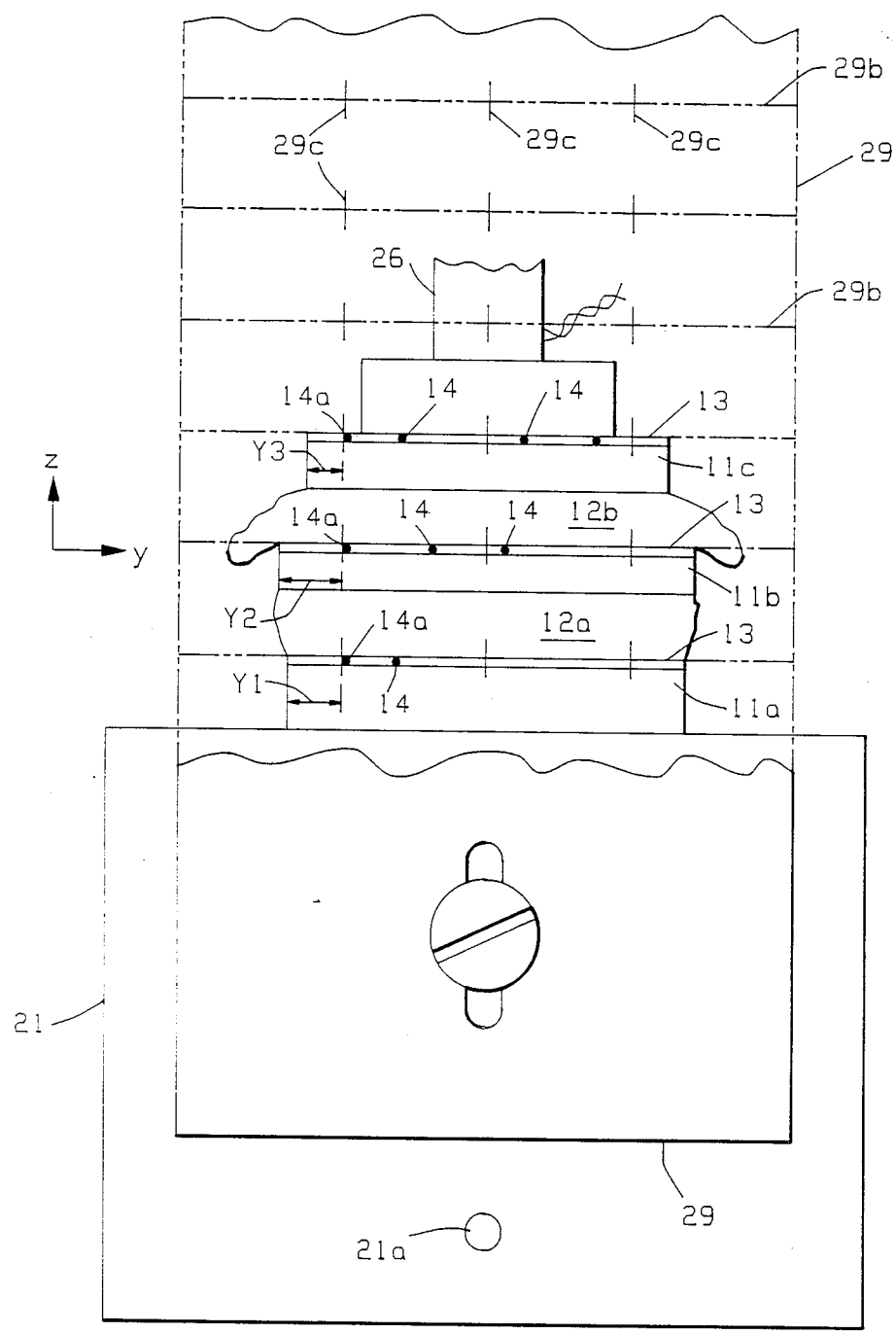
FIG. 3 is a detailed view of the FIG. 1 assembly taken in the X direction which shows additional novel structural features.

Considering next FIGS. 2 and 3, certain key additional details of the layered electronic assembly 10 and the process by which it is formed, will be described. FIG. 2 is an enlarged view taken along line 2 in FIG. 1, and FIG. 3 is an enlarged view taken along line 3 in FIG. 1. In these figures, chip 11c has been moved from its FIG. 1 position to a new position where it is in proper alignment with the previously assembled chips 11a and 11b. To accomplish this alignment, the reticle's flat surface 29a includes a plurality of accurately located horizontal lines 29b and cross hairs 29c. These lines 29b are spaced apart by a predetermined distance, and the chips 11a-11c are positioned by the micrometers 22a-24a such that their active surface 13 and the lines 29b are in alignment. By active surface of the chips is meant the surface on which transistors and their interconnections are integrated into the chip.

Each chip's active surface interconnections include a number of input/output leads (I/O leads) 14 which run to and end at the edge of the chip that is abutted against the reticle surface 29a. The ends of these I/O leads 14 are illustrated as dots in FIG. 3 since on the scale of the drawings the I/O leads are microscopic. Typically, the I/O leads 14 are about one-half to one mil wide, and one to two microns thick. In the alignment process, these I/O leads 14 are selectively aligned with the reticle cross hairs 29c. As an example, FIG. 3 shows the leftmost I/O lead 14a on each chip being in alignment with the leftmost column of cross hairs in the reticle 29.

A primary feature of the above-described layered electronic assembly 10 is that the chips 11a-11c have randomly different thicknesses; while at the same time, the spacing of the I/O leads 14 from one chip to the next chip is set at a predetermined distance. This is illustrated in FIGS. 2 and 3 wherein the chips 11a-11c have three different thicknesses T1, T2, and T3; but the Z axis spacing of the I/O leads 14 is a single distance D. Using the apparatus 20, the above feature is achieved by aligning the I/O leads 14 of each chip with the reticle lines 29b independent of chip thickness. During the alignment step, excess uncured adhesive is squeezed out from beneath the chip that is being attached; and thus the final adhesive layers vary in thickness such that they compensate for thickness variations in the chips.

Another feature of the layered electronic assembly 10 is that the I/O leads 14 are spaced from the edge of the chip on which they lie by distances which vary from chip to chip; while at the same time those I/O leads 14 are in alignment from chip to chip. This can be seen in FIG. 3. There the conductors 14a are offset from the edge of the chip 11a, 11b, and 11c by distances Y1, Y2, and Y3 respectively. With the apparatus 20, the conductors 14a are brought into alignment with each other by aligning them to the reticle cross hairs 29c.

Due to the above two features, all chips which electrically function after they have been cut from a wafer can be used in the assembly 10 That is, the chips in the assembly 10 do not have to be measured in thickness and hand picked based on their thickness; nor do they have to be carefully lapped to the same thickness; nor do they have to be carefully cut from the wafer such that the I/0 leads are all equally spaced from their side. Typically, integrated circuit chips vary in thickness by about ±1 mil across a wafer, and by about ±2 mil from wafer to wafer; and the accuracy with which chips are cut from a wafer is about ±1 mil. With the present invention, 100% of these chips can be assembled together.

Another feature of the assembly 10 is that the location of the I/O leads 14 against the reticle surface 29a is very accurate. That is important because it enables the I/O leads 14 to be selectively interconnected, after all of the layers of the assembly are put together, by finely patterned thin film conductors on the face 10a of the assembly 10 which lies against the reticle. Such conductors can be made reduced in width, and still contact the I/O leads 14, as the location of the I/O leads is made more accurate. Also, as the accuracy of the I/O leads 14 increases, more conductors can be routed on the assembly's face 10a between the I/O leads 14 without touching them.

In order to achieve all of the above features, the positioning stages 22, 23, 24 can be implemented in several different ways. One way is to use the series 4400 side-mounted drive models which are sold by DAEDAL, Inc. of Harrison City, Pa. Those stages have a positioning accuracy of ±0.05 mils per inch of travel; and thus, they can stack the chips 11a, 11b, . . . in the layered electronic assembly to a height of two inches with an overall accuracy of ±0.1 mil. Given a chip to chip pitch of twenty-five mils as an example, such a two-inch high assembly would contain up to eighty chips. Similar positioning accuracies can also be achieved with DAEDAL positioning stages that are motor driven; and that enables the assembly process to be automated. Additional positioning stages, such as one which rotates in the X-Y plane, can be mounted between the base 21 and stage 22 if added movement of the arm 25 is desired.

Also, various thermosetting epoxies 12 can be used to hold the chips together. One suitable epoxy is called H70E, and it is sold by EPOTEK Corp. A preferred characteristic of the epoxy 12 is that a layer of up to 10 mils thick will cure at a temperature of about 200° C. in less than five minutes. Such a short curing time enables the layered electronic assembly to be fabricated relatively quickly; and the H70E epoxy contains a catalyst which promotes rapid curing.

Further, several types of heaters 27 can be used to heat and cure the individual epoxy layers. In FIGS. 2 and 3, the electric heater 27 includes heating coils that are located in the tip of the vacuum chuck 26 which holds the integrated circuit chip. With that heater structure, heat is transferred from the coils through the chip via conduction to the underlying epoxy.

In addition, various holding mechanisms can be included in the apparatus 20 to prevent the layered assembly 10 from moving in the X and Y directions. One suitable holding mechanism, which is shown in FIG. 2, includes a channel 21a in the base 21. This channel 21 has an opening beneath the bottom chip 11a of the layered assembly, and the assembly is held in place by applying a vacuum to the channel.

Figure 4:
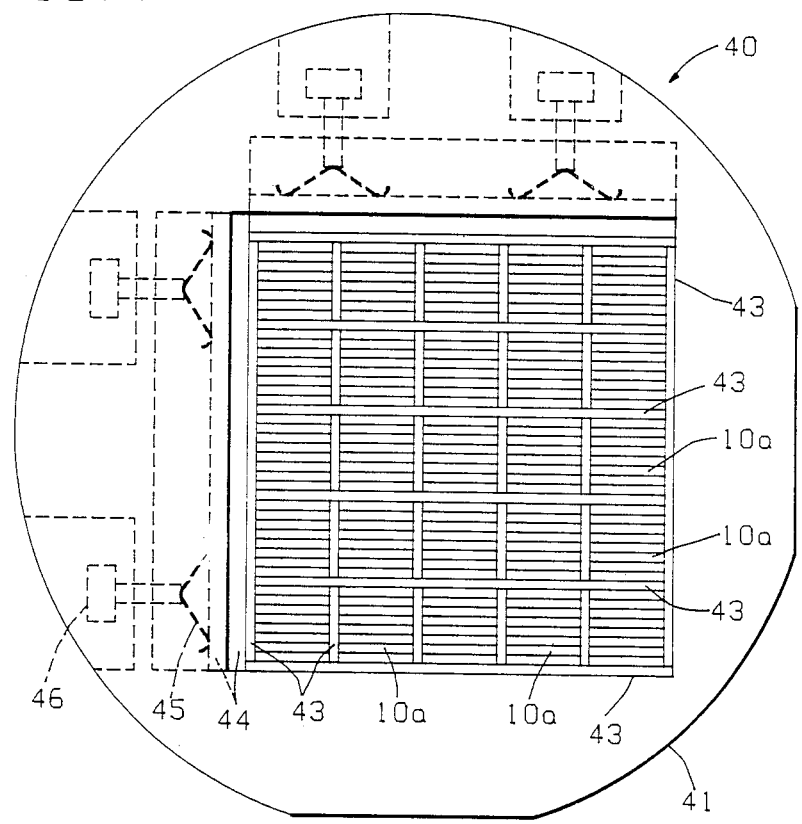
FIGS. 4 and 5 respectively are top and sectional views of a fixture which enables the I/O leads of the FIG. 1 assembly to be interconnected with patterned metal lines that are fabricated on several assemblies simultaneously.
Figure 5:
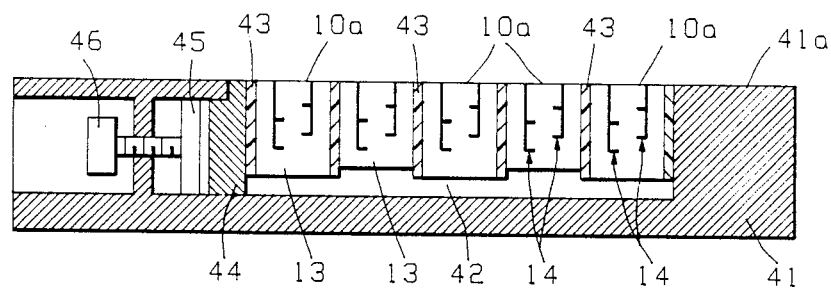

Turning next to FIGS. 4 and 5, they show a novel fixture 40 which is used in fabricating microscopic patterned conductors on the face 10a of several layered electronic assemblies simultaneously. This fixture 40 includes a body 41 with a flat surface 41a which has a rectangular-shaped aperture 42. A plurality of the layered electronic assemblies 10 are placed as a rectangular array in the aperture 42, and thin flat compressible spacers 43 are placed between the assemblies. To align the surface 10a of all of the assemblies with surface 41a of the fixture, an optical flat (not shown) is placed on the surface 41a such that it covers all of the assemblies 10, and then fixture 40 together with the optical flat are turned upside down.

While all of the layered electronic assemblies 10 are aligned as described above, they and the spacers 43 are mechanically squeezed together by means of components 44, 45, and 46. Each component 44 is a rigid moveable member which slides back and forth like a piston in cavity 42 parallel to the fixture surface 41a; each component 45 is a spring which pushes against a moveable member 44; and each component 46 is a screw which turns in the fixture body 41 and pushes against a spring. By tightening the screws 46 against the spring, the layered electronic assemblies 10 and spacers 43 are squeezed together with a force which keeps the assembly faces 10a in the plane of surface 41a after the fixture 40 is turned right side up.

Thereafter, microscopic patterned conductors which selectively interconnect the I/O leads 14 are fabricated on all of the exposed and aligned faces 10a in the fixture 40 simultaneously. To enable that to be accomplished, the fixture 40 has a perimeter which is shaped like a semiconductor wafer (i.e., round except for one or two small straight edges which serve as a reference in the fixture), and the assembly surfaces 10a in the fixture are arranged like integrated circuit chips in the wafer. Thus, the fixture 40 fits into standard equipment for fabricating integrated circuits on semiconductor wafers, such as step and repeat mask aligners and automated wafer tracks. Slight modifications may be made to such equipment in order to accommodate the fixture's added thickness and weight in comparison to a single semiconductor wafer.

An insulating layer is formed on surface 10a of all of the assemblies 10 by dispensing several drops of Benzocyclobutene (BCB) on the surfaces 10a, spinning the fixture 40 to produce a film of uniform thickness across the surfaces 10a, and baking the film. BCB is available from Dow Chemical Corp., and it is preferred over polyimide because it cures at a lower temperature. Thereafter, the BCB film is patterned with via holes which expose the ends of any I/O leads 14a which terminate on the assembly surface 10a. This is achieved by covering the BB with a thin film of photoresist and selectively exposing the resist with a step and repeat mask aligner which exposes the resist over each assembly, one at a time. Exposed portions of the BCB film are then removed by an etchant. Subsequently, patterned metal lines which selectively contact and interconnect the exposed I/O leads 14a are formed on the BCB film. This is achieved by sputtering an unpatterned layer of metal on the polyimide, covering the metal with patterned photoresist as described above, and etching the exposed portions of the metal.

Preferably, each of the assemblies 10 includes an extra chip on the top of the stack. This extra chip serves no electrical function; instead it extends surface 10a of the assembly past the I/O leads 14 of the chip to which it is attached. Thus, the conductors that are formed by the above steps to interconnect the I/O leads 14 do not have to run right to the edge of surface 10a.

A major feature of the above described fixture 40 is that it enables the interconnections to the I/O leads 14 to be fabricated on several assemblies simultaneously. FIG. 4 shows the fixture 40 holding an array of twenty-five assemblies. Thus, by using the fixture 40, the processing time and cost to form conductors on surface 10a is reduced by a factor of 2500% in comparison to any process which forms those same conductors on one assembly at a time. This savings is so large that it renders single assembly processing obsolete.

Also, by using the fixture 40, bead effects around the perimeter of the assembly surfaces 10a are eliminated. This occurs because the assembly surfaces 10a and the fixture surface 41a lie in the same plane. Thus liquid photoresist and/or liquid BCB which is spun onto the surfaces 10a and 41a beads up only on the perimeter of the fixture surface 41a—where it has no ill effects.

In addition, the uniformity of the liquid resist layers and insulating layers which are spun onto the assembly faces 10a is not degraded due to slippage of that liquid on the assembly faces. This is because the assembly faces lie away from the fixture's perimeter, and because the fixture's perimeter is essentially circular so there are no corners from which the liquid can slip off.

Further the fixture 40 provides a vehicle for moving the assemblies 10 from one processing machine to another (i.e., into and out of the photoresist spinning machine) without physically handling the assemblies themselves. Instead just the fixture is handled, and that eliminates damage to the conductors and insulating layers in the assemblies.

After the above circuit-forming steps are complete, the layered circuit assemblies 10 in the fixture 40 are redivided into separate modules. To accomplish that, the patterned layers which were deposited are severed between the assembly faces 10a in the space that is provided by the spacers 43. This severing step is performed by cutting through the layers with a saw which is thinner than the width of the spacers so that the assembly faces 10a are not damaged.

Another function which the spacers perform relative to the above severing step is that they form a seal which prevents liquids from flowing between the assemblies into the aperture 42. If certain liquids which are used to fabricate the layers on surface 10a (such as BB) were to seep into the cavity 42, those liquids would there cure and become solid, and that would make the severing of the assemblies difficult if not impossible. Suitably, the spacers 43 are made of strips of a synthetic resin polymer, such as ten to thirty mils thick strips of Teflon ™.

Figure 6:
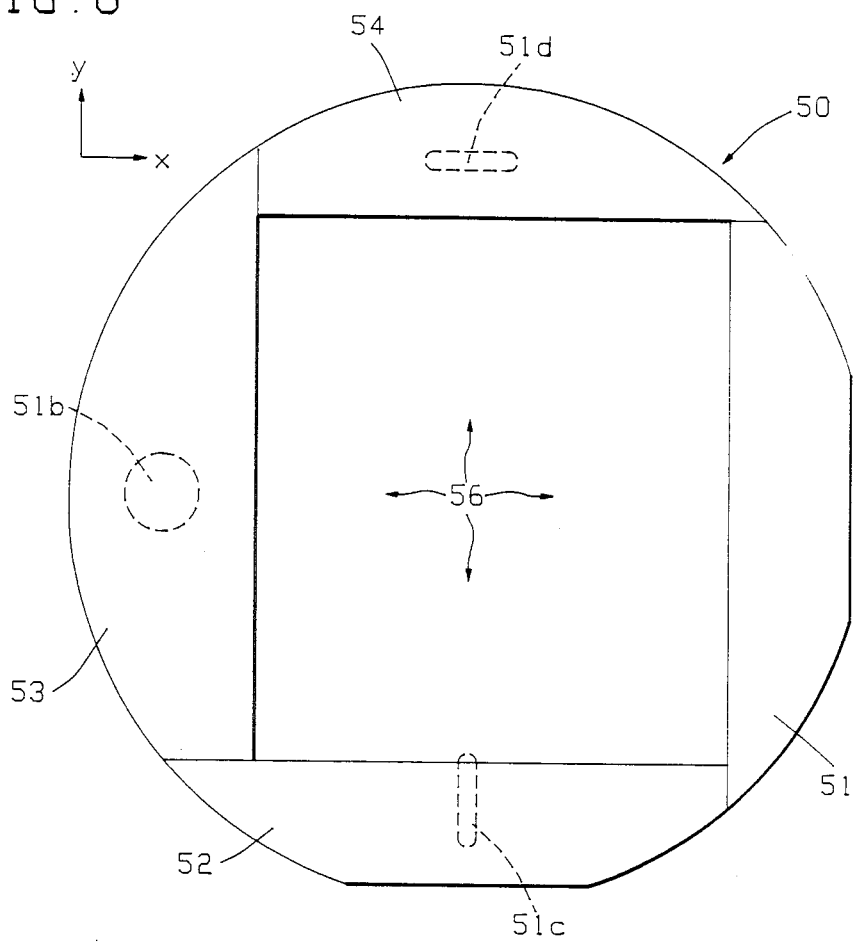
FIGS. 6 and 7 respectively are top and sectional views of another fixture which is an alternative to the fixture of FIGS. 4 and 5.
Figure 7:
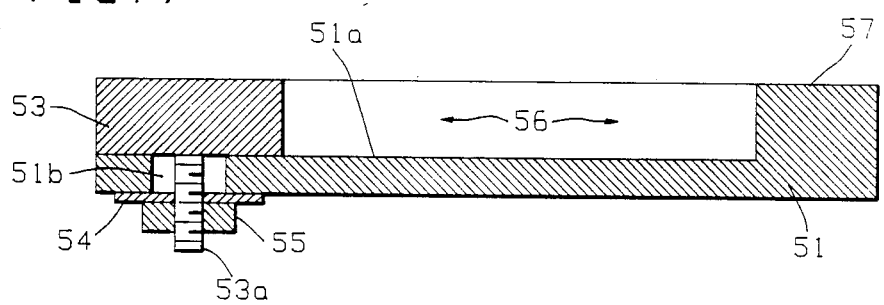

Turning next to FIGS. 6 and 7, they show an alternative embodiment 50 of the above described fixture. This embodiment 50 is comprised of a base member 51 and three other members 52, 53, and 54 which slide on a flat surface 51a of the base member. Passing through the base member 51 is a round hole 51b and two oblong holes 51c and 51d. Member 53 has a threaded stem 53a which extends through and loosely fits in hole 51b, and a washer 54 and a nut 55 are provided on the stem. Thus, member 53 can slide on surface 51a in both the X and Y direction and be tightened in position by the nut 55.

Similarly, members 52 and 54 have threaded stems which respectively fit into the holes 51c and 51d. Thus, member 54 can slide on surface 51a in the X direction, and member 52 can slide on surface 51a in the Y direction. Members 52 and 54 also have a washer and a nut (not shown) similar to items 54 and 55 on their threaded stem which secures them in position.

By moving the members 52, 53, and 54 as described above, a rectangular-shaped opening 56 is varied in size. This opening 56 is provided for holding an array of layered electronic assemblies 10 having spacers 43 between similar to the FIG. 4 array. While the assemblies 10 are so held, their exposed surfaces 10a will all lie in a single plane 57.

Various preferred embodiments of several novel structures, as well as novel methods for fabricating those structures, have now been described in detail. In addition, however, many changes and modifications can be made to those details without departing from the nature and spirit of the inventions. Accordingly, it is to be understood that the inventions are not limited to the above details but are defined by the appended claims.

What is claimed is:

1. A method of fabricating a layered electronic assembly with a plurality of integrated circuit chips which have respective thicknesses which vary from chip to chip, and have I/O leads which are offset from one edge of the chip on which they lie by respective distances which vary from chip to chip; said method including the steps of:
   disposing an uncured adhesive material between one of said chips "i" and another of said chips i+1 without regard to their respective thicknesses and respective distances by which their I/O leads are offset;
   moving said chips i and i+1 relative to one another with said uncured adhesive material lying between them until their I/O leads are aligned and separated by a predetermined spacing;
   curing said adhesive between said chips i and i+1 while their I/O leads are kept aligned and separated at said predetermined spacing; and
   repeating in a serial fashion, said forming, moving, and curing steps once for each remaining chip in said plurality, where i equals 1, 2, ... N.

2. A method according to claim 1 wherein said moving step includes the substep of holding said chip i+1 with a vacuum chuck while simultaneously aligning said chip i+1 to a reticle.

3. A method of fabricating a layered electronic assembly with a plurality of integrated circuit chips which have I/O leads on one surface of the chips and have respective thicknesses which vary from chip to chip; said method including the steps of:
   disposing an uncured adhesive material between one of said chips "i" and another of said chips i+1 without regard to their respective thicknesses;
   squeezing a portion of said uncured adhesive out from between said chips i and i+1 until their I/O leads are separated by a predetermined distance;
   curing said adhesive between said chips i and i+1 while their I/O leads are kept separated at said predetermined distance; and
   repeating in a serial fashion, said forming, squeezing, and curing steps once for each remaining chip in said plurality, where i equals 1, 2, ... N.

4. A method according to claim 3 wherein said squeezing step includes the substep of aligning said chip i+1 to marks on a transparent reticle.

5. A method according to claim 3 wherein said squeezing step includes the substep of holding said chip i+1 with a vacuum chuck, and positioning said chip i+1 with said chuck with an accuracy of better than one-tenth mil per inch.

6. A method according to claim 3 wherein said curing step includes the substep of heating chip i+1 and transferring that heat via conduction through chip i+1 to the adjacent adhesive.

7. A method according to claim 3 wherein said curing step includes the substep of heating said adhesive between chips i and i+1 for less than five minutes.

8. A method of fabricating a layered electronic assembly with a plurality of integrated circuit chips which have I/O leads that are offset from one edge of said chips by respective distances which vary from chip to chip; said method including the steps of:
- disposing an uncured adhesive material between one of said chips "i" and another of said chips i+1 without regard to the respective distances by which their I/O leads are offset;
- moving said chips i and i+1 relative to one another until their I/O leads are all aligned;
- curing said adhesive between said chips i and i+1 while their I/O leads are kept aligned; and
- repeating in a serial fashion, said forming, moving, and curing steps once for each remaining chip in said plurality, where i equals 1, 2, ... N.

9. A method according to claim 8 wherein said moving step includes the substep of visually aligning said I/0 leads on said chips i and i+1 to marks on a transparent reticle.

10. A method according to claim 8 wherein said moving step includes the substep of holding said chip i+1 with a vacuum chuck and positioning said chip i+1 by moving said chuck with an accuracy of better than one-tenth mil per inch.

11. A method according to claim 8 wherein said curing step includes the substep of heating chip i+1 and transferring that heat via conduction through chip i+1 to the adjacent adhesive.

12. A method according to claim 8 wherein said curing step includes the substep of heating said adhesive between chips i and i+1 for less than five minutes.

* * * * *